(12) United States Patent
Tiu et al.

(10) Patent No.: US 9,209,120 B2
(45) Date of Patent: Dec. 8, 2015

(54) SEMICONDUCTOR PACKAGE WITH LEAD MOUNTED POWER BAR

(71) Applicants: Kong Bee Tiu, Port Klang (MY); Chee Seng Foong, Sg. Buloh (MY); Wai Yew Lo, Petaling Jaya (MY)

(72) Inventors: Kong Bee Tiu, Port Klang (MY); Chee Seng Foong, Sg. Buloh (MY); Wai Yew Lo, Petaling Jaya (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 130 days.

(21) Appl. No.: 14/205,323

(22) Filed: Mar. 11, 2014

(65) Prior Publication Data
US 2015/0262924 A1 Sep. 17, 2015

(51) Int. Cl.
*H01L 23/495* (2006.01)
*H01L 23/00* (2006.01)

(52) U.S. Cl.
CPC ...... *H01L 23/49558* (2013.01); *H01L 23/4952* (2013.01); *H01L 23/49541* (2013.01); *H01L 23/49548* (2013.01); *H01L 23/49551* (2013.01); *H01L 23/49586* (2013.01); *H01L 24/49* (2013.01); *H01L 2224/05554* (2013.01); *H01L 2224/32245* (2013.01); *H01L 2224/48091* (2013.01); *H01L 2224/48247* (2013.01); *H01L 2224/4903* (2013.01); *H01L 2224/49109* (2013.01); *H01L 2224/73265* (2013.01); *H01L 2924/00014* (2013.01); *H01L 2924/181* (2013.01); *H01L 2924/19107* (2013.01)

(58) Field of Classification Search
CPC ................... H01L 23/49558; H01L 23/49586; H01L 23/50; H01L 23/495; H01L 23/4951; H01L 23/49; H01L 23/49575
USPC .......................................... 257/666, 676, 691
See application file for complete search history.

(56) References Cited

U.S. PATENT DOCUMENTS

| | | | | |
|---|---|---|---|---|
| 2,001,005 A | * | 5/1935 | Browne | G11B 7/28 200/84 R |
| 4,417,266 A | | 11/1983 | Grabbe | |
| 4,835,120 A | * | 5/1989 | Mallik | H01L 23/49527 174/530 |
| 5,200,362 A | | 4/1993 | Lin | |
| 5,220,195 A | * | 6/1993 | McShane | H01L 23/49503 257/666 |
| 5,252,853 A | | 10/1993 | Michii | |
| 5,428,547 A | * | 6/1995 | Ikeda | G05B 19/4184 700/174 |
| 5,508,556 A | | 4/1996 | Lin | |
| 5,544,412 A | | 8/1996 | Martinez | |
| 6,153,924 A | * | 11/2000 | Kinsman | H01L 23/49527 257/666 |
| 6,437,447 B1 | * | 8/2002 | Huang | H01L 23/49575 257/666 |
| 6,453,924 B1 | * | 9/2002 | Wang | F17C 11/00 137/1 |
| 6,462,404 B1 | * | 10/2002 | Schoenfeld | H01L 23/4951 257/666 |
| 7,737,537 B2 | * | 6/2010 | Bemmerl | H01L 23/49531 257/666 |
| 8,188,579 B1 | | 5/2012 | Kim | |
| 8,575,742 B1 | | 11/2013 | Kim | |
| 2010/0213587 A1 | | 8/2010 | Bemmerl | |
| 2015/0137337 A1 | * | 5/2015 | Hsieh | H01L 23/49541 257/676 |

* cited by examiner

*Primary Examiner* — S. V. Clark
(74) *Attorney, Agent, or Firm* — Charles Bergere

(57) ABSTRACT

A semiconductor package includes a lead frame having an interior region and leads surrounding the interior region, an integrated circuit, a region of insulating material, and a power bar. The integrated circuit, which is disposed in the interior region, has bond pads and electrical couplings (e.g., bond wires) between the bond pads and the leads. The region of insulating material is disposed on at least some of the lead frame leads and the power bar is disposed on the region of insulating material. There also are electrical couplings between the power bar and at least some of the bond pads.

14 Claims, 3 Drawing Sheets

SEMICONDUCTOR PACKAGE WITH LEAD MOUNTED POWER BAR

BACKGROUND OF THE INVENTION

The present invention relates generally to integrated circuit packaging and, more particularly, to lead frame based packages for semiconductor devices.

Certain semiconductor packages, such as quad flat packages (QFP), quad flat no-lead (QFN) packages, and power QFN (PQFN) packages, include one or more integrated circuit (IC) dies and/or other active components physically attached to a lead frame and electrically connected to the lead frame with bond wires spanning from bond pads on the die to corresponding leads of the lead frame. The IC dies, the bond wires, and an interior portion of the lead frame are encapsulated by a mold compound, leaving a portion of each lead exposed. These exposed portions serve as input and output (I/O) connections to the encapsulated IC dies and are typically located around the periphery of the QFP package. Compared to other types of semiconductor packages, QFP packages advantageously provide shorter electrical paths and faster signal communication rates and are therefore widely used for power elements and other IC dies.

In some QFP packages, connections between bond pads on the IC dies and a power source are made with one or more dedicated power bars, which serve as hubs, disposed within the QFP package. In these configurations, a plurality of leads of the lead frame, referred to as dummy leads, are electrically coupled to the power bars and the power bars are then electrically connected to one or more of the IC bond pads. However, such use of QFP package leads as dummy leads reduces the total number of leads available for input/output (I/O) interconnection. Thus, it would be advantageous to reduce or eliminate the need for such dummy leads.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

Certain embodiments of the present invention are QFP packages that provide certain advantages of dedicated power bars without using dummy QFP package leads. Some embodiments of the invention are semiconductor packages, and other embodiments are methods for assembling semiconductor packages.

In one embodiment, the present invention provides a semiconductor package including a lead frame having an interior region and comprising a plurality of leads; an active component having a plurality of bond pads, where the active component is disposed in the interior region of the lead frame; one or more electrical couplings between at least one of the bond pads and at least one of the leads of the lead frame; a first region of insulating material disposed on a first subset of the leads of the lead frame; a first power bar disposed on the first region of insulating material; and one or more electrical couplings between the first power bar and one or more of the bond pads.

Figure 1:
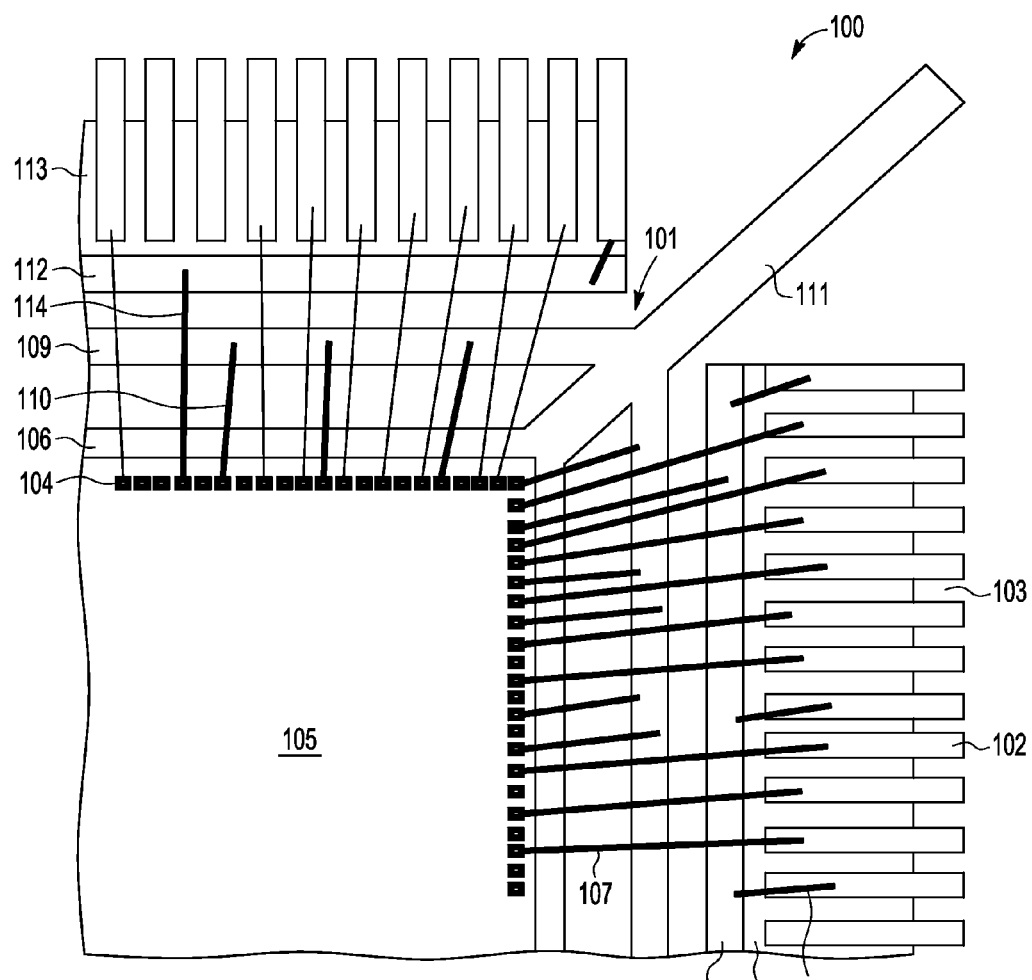
FIG. 1 shows a top cross-sectional view of a portion of the interior of an exemplary quad flat package (QFP) in accordance with one embodiment of the present invention.
Figure 2:
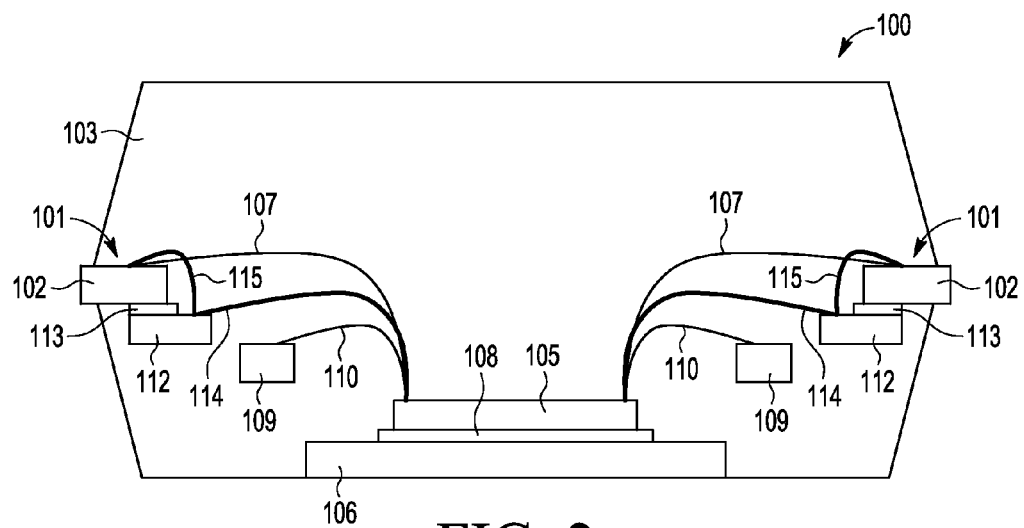
FIG. 2 shows a side cross-sectional view of the semiconductor package of FIG. 1.

Referring now to FIG. 1, a top cross-sectional view of a portion of the interior of an exemplary quad flat package (QFP) type semiconductor package 100 consistent with one embodiment of the invention is shown, and FIG. 2 shows a side cross-sectional view of semiconductor package 100 of FIG. 1. It is noted that alternative embodiments are not limited to QFP packages, but can be implemented for other package types, such as (without limitation) power QFN (PQFN) packages, ball grid array (BGA) packages, molded array packages (MAP), and quad flat no-lead (QFN) or other no-lead packages.

The semiconductor package 100 comprises a lead frame 101 having multiple metal peripheral leads 102 separated by and embedded within an electrically-insulating molding compound 103. The peripheral leads 102 are electrically connected to bond pads 104 on an active component or IC die 105 and/or to external electrical components (not shown) to allow the IC die 105 to operate with those external components. The molding compound 103 may be an epoxy or other suitable material, as is known to those of skill in the art.

The lead frame 101 functions as a base onto which other elements of the semiconductor package 100 are mounted. In particular, in this embodiment, the lead frame 101 includes an exposed pad 106 (e.g., a flag, a ground connection, or heat sink) in a lower and central surface thereof. The exposed pad 106 is adapted to receive the IC die 105 (or other active component), which is mounted in a central region of the exposed pad 106. The IC die 105 is a well-known component of semiconductor packages, and the invention is not limited to any particular type of die (e.g., microprocessor, memory, ASIC, etc.) and therefore a detailed description thereof is not necessary for a complete understanding of the invention.

One or more bond pads 104 on the IC die 105 are electrically coupled to one or more peripheral leads 102 of the lead frame 101 with bond wires 107 to interface with input and output (I/O) connections external to the semiconductor package 100.

The IC die 105 is disposed on the exposed pad 106 by means of a die-attach layer 108, which may include an epoxy compound, electrically-insulating die-attach adhesive, die-attach tape, solder, or the like, all of which are known to those of skill in the art.

As shown in FIGS. 1 and 2, the lead frame 101 includes a rectangular-shaped (e.g., square) ground ring 109 formed therein. The ground ring 109 is used as a hub for one or more ground connections between bond pads 104 on the IC die 105 and one or more ground connections external to the semiconductor package 100 when the semiconductor package 100 is connected to external components. Accordingly, one or more bond pads 104 on the IC die 105 are electrically coupled to the ground ring 109 with bond wires 110 to interface with ground connections external to the semiconductor package 100, and the ground ring 109 is coupled to external ground connections with tie bars 111.

According to embodiments of the present invention, a plurality of peripheral leads 102 of the lead frame 101 are used as a support for power bars 112, as will now be described.

Figure 3:
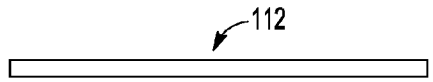
FIG. 3 shows a front view of a power bar of the semiconductor package of FIG. 1.
Figure 4:
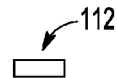
FIG. 4 shows a side view of the power bar of the semiconductor package of FIG. 1.

In the embodiment of FIG. 1, a power bar 112 is disposed along each of the four lateral sides of the semiconductor package 100. Each power bar 112 is a generally parallelepiped structure, as can be seen in the front and side views of the power bar 112 shown in FIGS. 3 and 4, respectively.

The power bars 112 are metal bars, metal strips, metal frames, or the like. The power bars 112 may be constructed from copper or another electrically-conductive material and may be surface-finished with one or more of silver, nickel, palladium, and gold, to enhance wire-bonding connections with the power bars 112.

Each power bar 112 is mounted onto peripheral leads 102 by means of a region of insulating material or a section of adhesive material 113 (e.g., double-sided tape, such as polyimide tape or the like) that also serves to electrically insulate the power bar 112 from the peripheral leads 102.

The power bars 112 are used as hubs for one or more power connections between the bond pads on the IC die 105 and one or more power connections external to the semiconductor package 100. Accordingly, one or more bond pads 104 on the IC die 105 are electrically connected to the power bars 112 with bond wires 114, and one or more peripheral leads 102 of the lead frame 101 are also electrically coupled to the power bars 112 with bond wires 115 to interface with power connections external to the semiconductor package 100.

During the assembly of the semiconductor package 100, the mounting of the power bars 112 may be performed, for example, after the lead frame 101 is stamped or etched, but before any wire bonding is performed. The power bars 112 are desirably mounted in a manner and location so as to provide sufficient access and exposure for electrical connections to the power bars 112 to be made using the bond wires 114 and 115, as described above.

In addition to providing power hubs, which permit greater flexibility in making wire-bonding connections and eliminate the use of dummy peripheral leads, the foregoing-described arrangement may also enhance the strength and quality of wire-bond connections 115, 107 made to peripheral leads 102 through the presence of adhesive material 113 and power bar 112, which secure peripheral leads 102 firmly in place.

Figure 5:
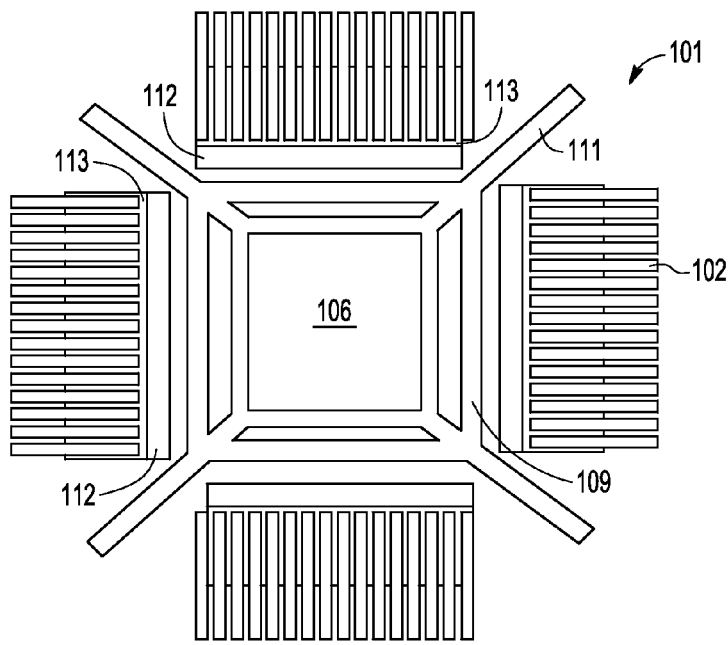
FIG. 5 shows a top plan view of an exemplary metal lead frame used to assemble the semiconductor package of FIG. 1, including mounted power bars.

FIG. 5 shows a top plan view of lead frame 101 of FIG. 1 with power bars 112 mounted, but before IC die 105 has been mounted or any wire-bonding has been performed. Each power bar 112 is mounted onto a row of package leads 102 by means of a discrete portion of adhesive material 113. As shown, in the configuration of FIG. 5, each of the four sides of package leads 102 has its own respective, separate power bar 112. Power bars 112 can all be but do not necessarily have to be coupled to the same power source. For example, in some applications, it might be desirable for each of the four power bars 112 to provide power at a different voltage. It is noted that, in alternative embodiments, a single portion of adhesive material may be used to mount all four power bars 112 to their respective rows of package leads 102.

Figure 6:
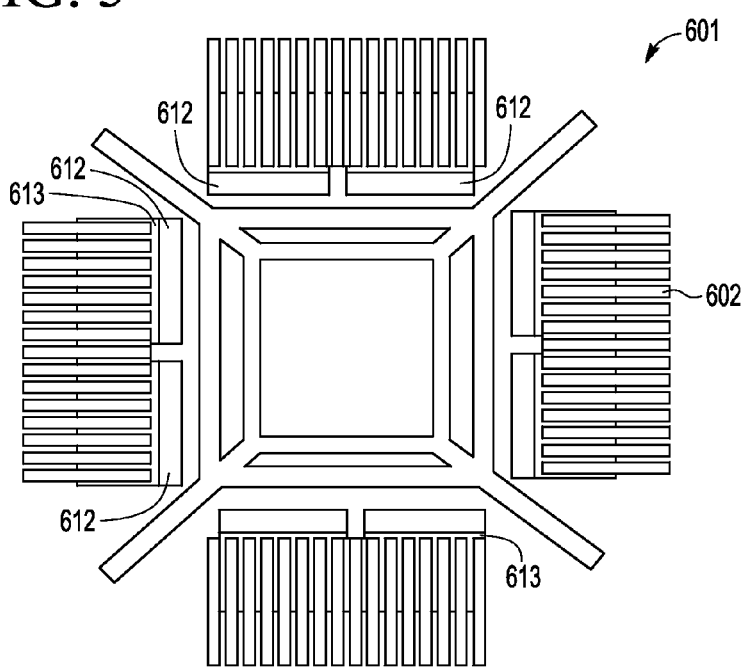
FIG. 6 shows a top plan view of an exemplary lead frame used to assemble a semiconductor package consistent with a second alternative embodiment of the invention, with mounted power bars.

FIG. 6 shows a top plan view of an exemplary metal lead frame 601 used to assemble a semiconductor package consistent with a second alternative embodiment of the invention, with power bars 612 mounted. The lead frame 601 is similar to lead frame 101 of FIGS. 1, 2, and 5, except for the following differences. As shown, in the configuration of FIG. 6, there are two different power bars 612 disposed on each of the four sides of package leads 602, for a total of eight power bars. Each of the power bars 612 is mounted onto a respective subset of package leads 602 by a respective portion of adhesive material 613. The power bars 612 can all be but do not necessarily have to be coupled to the same power source.

Figure 7:
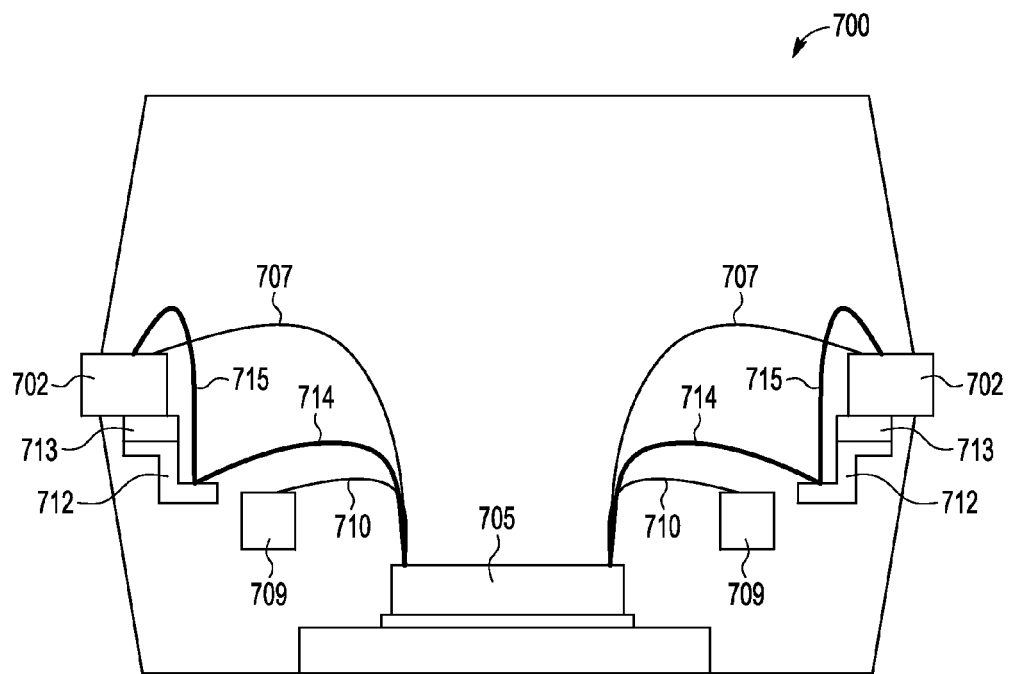
FIG. 7 shows a side cross-sectional view of a portion of an exemplary semiconductor package consistent with a third alternative embodiment of the present invention.

FIG. 7 shows a side cross-sectional view of a portion of an exemplary semiconductor package 700 consistent with a third alternative embodiment of the invention. In this embodiment, a power bar having a step-shaped cross-section is employed, to improve looping clearance between bond wires.

As shown, semiconductor package 700 is similar to semiconductor package 100 of FIG. 1. As in the embodiment of FIG. 1, a power bar 712 is disposed along each of the four sides of semiconductor package 700, mounted onto peripheral leads 702 by means of a section of adhesive material 713 that also serves to electrically insulate power bar 712 from peripheral leads 702. However, instead of employing a power bar 112 having a rectangular cross-section, semiconductor package 700 employs an elongated power bar 712 having a step-shaped cross section, as can be seen in the front and side views of power bar 712 shown in FIGS. 8 and 9, respectively. Semiconductor package 700 has bond wires 707 from IC die 705 to peripheral leads 702, bond wires 710 from IC die 705 to ground ring 709, bond wires 714 from IC die 705 to power bar 712, and bond wires 715 from power bar 712 to peripheral leads 702. The additional clearance created by the step shape in power bar 712 reduces the incidence of interference between peripheral-lead bond wires 707 and power-bar bond wires 714, 715.

A semiconductor package consistent with embodiments of the invention permits a flexible, open-tool design and enables low-cost packaging for IC dies and other active components. While conventional packaging typically employs predefined locations and pre-assigned peripheral leads that are designated for use as power leads, embodiments of the invention allow lead frames for new packages to be designed without such requirements, permitting greater adaptability with a wide variety of active components.

Although FIGS. 1-9 show embodiments of the invention implemented in a semiconductor package with an exposed pad (i.e., an exposed metal plate, bond pad, flag pad, or the like), it should be recognized that embodiments of the invention could be alternatively be implemented in non-exposed-pad (EP) type semiconductor packages.

Figure 8:
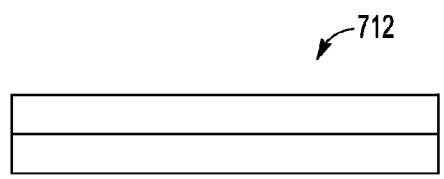
FIG. 8 shows a front view of the power bar of the semiconductor package of FIG. 7.
Figure 9:
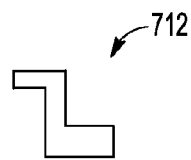
FIG. 9 shows a side view of the power bar of the semiconductor package of FIG. 7.

The term "power bar," as used herein, should be understood to include a power bar, as well as any other one or more portions of conductive material that are mounted onto and insulated from peripheral leads. For example, FIGS. 1-6 show a power bar having a rectangular cross section, and FIGS. 7-9 show a power bar having a step-shaped cross section. However, in alternative embodiments, power bars having circular or other shaped cross sections may be used. The term "power bar" does not necessarily imply an elongated portion of conductive material and includes portions of conductive material of varying dimensions, sizes, and shapes.

In some embodiments, one or more adjacent power bars may be electrically and/or mechanically coupled to one another in a substantially annular configuration to form a "power ring," similar to a ground ring, that may be generally square or rectangular in form. The phrase "substantially annular," as used herein, should be understood to include complete, unbroken rings, as well as broken rings, and rings in multiple segments. "Substantially annular" also includes shapes that comprise portions that may be curved, angular, and/or straight, and should not be interpreted literally to require the presence of a ring, a curved shape, a contiguous shape, or even a single shape.

In some embodiments, one or more power bars may be used to provide ground voltage levels instead of power-supply voltage levels.

Although embodiments of the invention are described herein as involving lead frames that are not pre-molded, it should be understood that alternative embodiments are possible in which pre-molded lead frames are used.

It should be understood that the invention is not limited to one or more IC dies disposed within a lead frame and/or can be used with one or more other active components disposed within a lead frame as well. Accordingly, the term "active component" should be understood as including any type of circuitry that performs any suitable type of function.

Although embodiments of the invention are described with respect to a quad flat package (QFP), the teachings described herein can be used to fabricate quad flat no lead (QFN) packages, dual flat no lead packages (DFN), and other types of packages where two or more physical bond-wire segments form a single electrical interconnection between an IC die and a lead frame via a routing substrate.

Although embodiments of the invention are described herein employing pre-plated lead frames, it should be understood that other types of lead frames may be used in other embodiments of the invention.

By now it should be appreciated that there has been provided an improved packaged semiconductor package and a method of forming the improved packaged semiconductor package. Circuit details are not disclosed because knowledge thereof is not required for a complete understanding of the invention.

Although the invention has been described using relative terms such as "front," "back," "top," "bottom," "over," "above," "under," "left," and "right," and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

As used herein, the term "mount," as in "a power bar mounted on peripheral leads" or a step of "mounting a power bar onto peripheral leads," covers all situations in which the power bar is physically coupled to the peripheral leads, regardless of the intervening components or structures (e.g., one or more sections of adhesive and/or insulating material) used to achieve the physical coupling to the peripheral leads.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A semiconductor package, comprising:
   a lead frame having an interior region and a plurality of leads surrounding the interior region;
   an integrated circuit having a plurality of bond pads, wherein the integrated circuit is disposed in the interior region of the lead frame;
   one or more electrical couplings between at least one of the bond pads and at least one of the leads of the lead frame;
   a first region of insulating material disposed on a first subset of the lead frame leads;
   a first power bar disposed on the first region of insulating material;
   one or more electrical couplings between the first power bar and one or more of the bond pads; and
   one or more other power bars respectively disposed on one or more other regions of insulating material respectively disposed on one or more other subsets of the leads, wherein two or more of the power bars are mounted adjacent to a single lateral side of the integrated circuit.

2. The semiconductor package of claim 1, further comprising one or more electrical couplings between the first power bar and one or more of the leads.

3. The semiconductor package of claim 1, wherein two or more power bars are mounted adjacent to two or more different lateral sides of the integrated circuit.

4. The semiconductor package of claim 1, wherein the two or more power bars are electrically and/or mechanically coupled to one another in a substantially annular configuration.

5. The semiconductor package of claim 1, wherein the first power bar has a step-shaped cross section.

6. The semiconductor package of claim 1, wherein the first region of insulating material comprises a double-sided adhesive tape.

7. The semiconductor package of claim 6, wherein the first power bar comprises a strip of copper.

8. The semiconductor package of claim 1, wherein the interior region includes a flag and the integrated circuit is mounted on the flag.

9. The semiconductor package of claim 1, wherein the electrical couplings comprise bond wires.

10. A semiconductor package, comprising:
    a lead frame having an interior region and a plurality of leads surrounding the interior region;
    an integrated circuit having a plurality of bond pads, wherein the integrated circuit is disposed in the interior region of the lead frame;
    first bond wires electrically connecting at least some of the bond pads and at least some the leads;
    a first region of insulating material disposed on a first subset of the leads, wherein the first region of insulating material comprises a double sided adhesive tape;
    a first power bar disposed on the first region of insulating material, wherein the first power bar comprises a strip of copper;
    second bond wires electrically connecting the first power bar with one or more other ones of the bond pads; and
    one or more other power bars respectively disposed on one or more other regions of insulating material respectively disposed on one or more other subsets of the leads, wherein two or more of the power bars are mounted adjacent to a single lateral side of the integrated circuit.

11. The semiconductor package of claim 10, further comprising third bond wires electrically connecting the first power bar and one or more other ones of the leads.

12. The semiconductor package of claim 10, wherein two or more power bars are mounted adjacent to two or more different lateral sides of the integrated circuit.

13. The semiconductor package of claim 10, wherein the two or more power bars are electrically and/or mechanically coupled to one another in a substantially annular configuration.

14. The semiconductor package of claim 10, wherein the first power bar has a step-shaped cross section.

* * * * *